(12) United States Patent
Katayama (10) Patent No.: US 8,865,490 B2
(45) Date of Patent: Oct. 21, 2014

(54) METHOD FOR PRODUCING LIGHT-EMITTING DIODE DEVICE

(75) Inventor: Hiroyuki Katayama, Osaka (JP)

(73) Assignee: Nitto Denko Corporation, Osaka (JP)

( * ) Notice: Subject to any disclaimer, the term of this patent is extended or adjusted under 35 U.S.C. 154(b) by 88 days.

(21) Appl. No.: 13/180,727

(22) Filed: Jul. 12, 2011

(65) Prior Publication Data

US 2012/0028388 A1  Feb. 2, 2012

(30) Foreign Application Priority Data

Jul. 27, 2010 (JP) ................................. 2010-168434

(51) Int. Cl.
- H01L 21/00 (2006.01)
- H01L 33/50 (2010.01)
- H01L 33/56 (2010.01)

(52) U.S. Cl.
CPC ............ *H01L 33/50* (2013.01); *H01L 2933/005* (2013.01); *H01L 2933/0041* (2013.01); *H01L 33/56* (2013.01); *H01L 33/501* (2013.01)
USPC ......................................................... 438/27

(58) Field of Classification Search
CPC ............... C09K 11/02; C09K 11/7774; H01L 2933/005
See application file for complete search history.

(56) References Cited

U.S. PATENT DOCUMENTS

| 8,247,248 B2 * | 8/2012 | Ling | 438/27 |
| 2007/0013057 A1 * | 1/2007 | Mazzochette | 257/723 |
| 2007/0096113 A1 | 5/2007 | Inoshita et al. | |
| 2008/0239724 A1 | 10/2008 | Moriyama et al. | |
| 2009/0061549 A1 | 3/2009 | Harada et al. | |
| 2009/0134426 A1 | 5/2009 | Katayama et al. | |
| 2009/0227757 A1 | 9/2009 | Katayama et al. | |
| 2010/0148378 A1 | 6/2010 | Katayama et al. | |

FOREIGN PATENT DOCUMENTS

| EP | 1 737 049 A1 | 12/2006 |
| JP | 2004-343149 A | 12/2004 |
| JP | 2009-60031 A | 3/2009 |
| JP | 2009-127020 A | 6/2009 |
| JP | 2009-127021 A | 6/2009 |
| JP | 2009-235376 A | 10/2009 |
| JP | 2010-285593 A | 12/2010 |

OTHER PUBLICATIONS

Extended European Search Report dated Jul. 28, 2014, from the European Patent Office in counterpart European Patent application No. 11175171.5.

* cited by examiner

*Primary Examiner* — Mohsen Ahmadi
*Assistant Examiner* — Andre' C Stevenson
(74) *Attorney, Agent, or Firm* — Sughrue Mion, PLLC (57) ABSTRACT

A method for producing a light-emitting diode device includes a step of preparing a sealing layer by sealing in a light-emitting diode with a sealing material; a step of preparing a fluorescent layer by allowing a phosphor-containing resin composition containing phosphor and silicone resin to reach its B-stage; and a step of bonding the fluorescent layer to the surface of the sealing layer.

2 Claims, 2 Drawing Sheets

METHOD FOR PRODUCING LIGHT-EMITTING DIODE DEVICE

CROSS-REFERENCE TO RELATED APPLICATION

The present application claims priority from Japanese Patent Application No. 2010-168434 filed on Jul. 27, 2010, the contents of which are hereby incorporated by reference into this application.

BACKGROUND OF THE INVENTION

1. Field of the Invention

The present invention relates to a method for producing a light-emitting diode device.

2. Description of Related Art

A white light-emitting device has been known recently as a light-emitting device capable of emitting high energy light. A white light-emitting device is provided with, for example, an LED (light-emitting diode) that emits blue light, and a fluorescent layer that is capable of converting blue light into yellow light and that covers the LED; and the white light-emitting device emits high energy white light by mixing colors of blue light emitted from the LED and yellow light converted from the blue light at the fluorescent layer.

As such a light-emitting device, for example, Japanese Unexamined Patent Publication No. 2009-60031 (Example 2) has proposed an optical semiconductor device manufactured as follows.

That is, an integrated sealing sheet, in which a depressed portion of a first layer is charged with a second layer, is prepared as follows: silicone varnish, in which phosphor is dispersed in silicone resin, is injected in the depressed portion of the first layer made of epoxy resin, and then the silicone varnish is dried, thereby forming the second layer.

Separately, a mounting substrate is prepared by mounting an LED element on a substrate.

Thereafter, by laminating the integrated sealing sheet onto the mounting substrate so as to bring the second layer into contact with the LED element, the LED element is embedded in the integrated sealing sheet.

SUMMARY OF THE INVENTION

However, in the production method of Japanese Unexamined Patent Publication No. 2009-60031, there is a case where the LED element is damaged based on the stress applied when brought into contact with the second layer, and also the LED element may not be sealed in sufficiently with the second layer.

An object of the present invention is to provide a method for producing a light-emitting diode device; with the method, damages to the light-emitting diode can be prevented, and the light-emitting diode can be reliably sealed in with the sealing layer.

A method for producing a light-emitting diode device of the present invention includes the steps of: preparing a sealing layer by sealing in a light-emitting diode with a sealing material; preparing a fluorescent layer by allowing a phosphor-containing resin composition containing phosphor and silicone resin to reach its B-stage; and bonding the fluorescent layer to the surface of the sealing layer.

In this method, the light-emitting diode is sealed in with a sealing material in advance, and therefore even if the fluorescent layer is bonded to the surface of the sealing layer, damages to the light-emitting diode can be reliably prevented.

Therefore, reliability of the light-emitting diode, and also the light-emitting diode device can be improved.

Thus, an excellently reliable light-emitting diode device can be used in various semiconductor devices.

In the method for producing a light-emitting diode device of the present invention, it is preferable that, in the step of preparing the sealing layer, a housing is placed so as to surround the light-emitting diode, and interior of the housing is charged with the sealing material; and in the step of bonding the fluorescent layer to the surface of the sealing layer, the fluorescent layer is bonded to both of the surface of the sealing layer and to the surface of the housing.

When the housing is be placed so as to surround the light-emitting diode; the sealing layer and the fluorescent layer are laminated in advance; and then the sealing layer of the laminate is used to charge the interior of the housing, the peripheral end portions of the sealing layer are disposed between the housing and the fluorescent layer. Therefore, the peripheral end portions of the sealing layer are pressed by both of the housing and the fluorescent layer, sometimes causing the peripheral end portions of the sealing layer to spill over to the outside of the housing. In such a case, functions of the light-emitting diode device may be affected.

However, in this method, the fluorescent layer is bonded to both of the surface of the sealing layer and the surface of the housing, and therefore the sealing layer can be prevented from spilling over to the outside of the housing.

Furthermore, because the phosphor-containing resin composition that forms the fluorescent layer is in B-stage, the fluorescent layer can be bonded to the surface of the housing, and by curing the phosphor-containing resin composition thereafter, the fluorescent layer can be reliably allowed to adhere to the surface of the housing.

Thus, reliability of the light-emitting diode device can be further improved.

DETAILED DESCRIPTION OF THE INVENTION

In a method for producing a light-emitting diode device of the present invention, a sealing layer is prepared by sealing in a light-emitting diode with a sealing material; a fluorescent layer is prepared by allowing a phosphor-containing resin composition containing phosphor and silicone resin to reach its B-stage; and then thereafter, the fluorescent layer is bonded to the surface of the sealing layer.

Examples of the sealing material include known transparent resins such as silicone resin, epoxy resin, and acrylic resin. A preferable example of the sealing material is silicone resin, in view of durability. Examples of the silicone resin include also a silicone resin composition (described later) contained in the phosphor-containing resin composition. The sealing material may be used alone or in combination of two or more.

Examples of the light-emitting diode include mainly a blue light-emitting diode (blue LED) which emits blue light.

Examples of the phosphor include yellow phosphor which can convert blue light into yellow light. Examples of such a phosphor include a phosphor containing composite metal oxide or metal sulfide doped with, for example, metal atoms such as cerium (Ce) and europium (Eu).

Examples of the phosphor include, to be specific, garnet phosphors having a garnet crystal structure such as $Y_3Al_5O_{12}$: Ce (YAG (yttrium.aluminum.garnet): Ce), $(Y,Gd)_3Al_5O_{12}$: Ce, $Tb_3Al_3O_{12}$: Ce, $Ca_3Sc_2Si_3O_{12}$: Ce, and $Lu_2CaMg_2(Si, Ge)_3O_{12}$: Ce; silicate phosphors such as $(Sr,Ba)_2SiO_4$: Eu, $Ca_3SiO_4Cl_2$: Eu, $Sr_3SiO_5$: Eu, $Li_2SrSiO_4$: Eu, and $Ca_3Si_2O_7$: Eu; aluminate phosphors such as $CaAl_{12}O_{19}$: Mn and $SrAl_2O_4$: Eu; sulfide phosphors such as ZnS: Cu, Al, CaS: Eu, $CaGa_2S_4$: Eu, and $SrGa_2S_4$: Eu; oxynitride phosphors such as $CaSi_2O_2N_2$: Eu, $SrSi_2O_2N_2$: Eu, $BaSi_2O_2N_2$: Eu, and Ca-α-SiAlON; nitride phosphors such as $CaAlSiN_3$: Eu and $CaSi_5N_8$: Eu; and fluoride phosphors such as $K_2SiF_6$: Mn and $K_2TiF_6$: Mn. A preferable example is a garnet phosphor, and a more preferable example is $Y_3Al_5O_{12}$: Ce.

The phosphor is particulate, and its shape is not particularly limited. Examples of the phosphor shape is generally spherical, a generally flat plate shape, and a generally needle shape.

The average particle size (average of the maximum lengths) of the phosphor is, for example, 0.1 to 30 μm, or preferably 0.2 to 20 μm. The average particle size of the phosphor particles is measured with a particle size distribution analyzer.

The phosphor may be used alone, or may be used in combination.

Examples of the silicone resin (silicone resin contained in the phosphor-containing resin composition) include a thermosetting silicone resin, and examples of the thermosetting silicone resin include a silicone resin composition, a boron compound-containing silicone resin composition, and an aluminum compound-containing silicone resin composition.

The silicone resin composition is a composition that is capable of undergoing condensation reaction and addition reaction (to be specific, a hydrosilylation reaction), to be more specific, a composition that is capable of undergoing condensation reaction by being heated to reach its B-stage (semi-cured state) and then undergoing addition reaction by further being heated to be cured (completely cured).

The silicone resin composition contains, for example, polysiloxane having silanol on both of its terminal ends (silanol-terminated polysiloxane), alkenyl group-containing alkoxysilane, epoxy group-containing alkoxysilane, and organohydrogensiloxane. Silanol-terminated polysiloxane, alkenyl group-containing alkoxysilane, and epoxy group-containing alkoxysilane are condensation ingredients (an ingredient that is subjected to condensation reaction); and alkenyl group-containing alkoxysilane, and organohydrogensiloxane are addition ingredients (an ingredient that is subjected to addition reaction).

Silanol-terminated polysiloxane is a silane compound having a silanol group (SiOH group) at both molecular terminals. To be specific, silanol-terminated polysiloxane is represented by formula (1) below:

[Chem. 1]

(where R1 and R2 are a monovalent hydrocarbon group, "n" is an integer of 1 or more. R1 and R2 are the same or different.)

In the above-described formula (1), R1 and R2 are preferably the same.

The monovalent hydrocarbon group represented by R1 and R2 is a saturated or unsaturated monovalent hydrocarbon group, and examples thereof include a straight chain, a branched, and a cyclic hydrocarbon group. The number of carbon atoms in the hydrocarbon group is, for example, 1 to 20, or preferably 1 to 10 in view of ease in preparation or thermal stability.

Examples of the monovalent hydrocarbon group include, to be specific, saturated aliphatic hydrocarbon groups such as methyl, ethyl, propyl, isopropyl, butyl, isobutyl, pentyl, cyclopentyl, hexyl, and cyclohexyl; and aromatic hydrocarbon groups such as phenyl and naphthyl.

A preferable monovalent hydrocarbon group is a saturated aliphatic hydrocarbon group, and a more preferable monovalent hydrocarbon group is methyl in view of transparency and light resistance.

In the above-described formula (1), "n" is preferably an integer of 1 to 10000, or more preferably an integer of 1 to 1000 in view of stability and/or handleability.

Examples of the silanol-terminated polysiloxane include, to be specific, silanol-terminated polydimethylsiloxane, silanol-terminated polymethylphenylsiloxane, and silanol-terminated polydiphenylsiloxane. A preferable example is silanol-terminated polydimethylsiloxane.

As silanol-terminated polysiloxane, a commercially available product can be used, or silanol-terminated polysiloxane synthesized based on a known method can be used.

Silanol-terminated polysiloxane may be used alone or in combination of two or more.

Silanol-terminated polysiloxane is a mixture of compounds having different "n" (that is, having different molecular weights).

Therefore, the "n" in the above-described formula (1) is calculated as an average value.

The number average molecular weight of silanol-terminated polysiloxane is, for example, 100 to 1,000,000, or preferably 200 to 100,000, in view of stability and/or handleability. The number average molecular weight is calculated by gel permeation chromatography based on polystyrene standard. The number average molecular weight described later is also calculated as described above.

The mixing ratio of silanol-terminated polysiloxane is, for example, 1 to 99.99 mass %, preferably 50 to 99.9 mass %, or more preferably 80 to 99.5 mass % per total amount of the condensation ingredients.

Alkenyl group-containing alkoxysilane is a silane compound having an alkenyl group and also an alkoxy group. To be specific, alkenyl group-containing alkoxysilane is alkenyl group-containing trialkoxysilane represented by formula (2) below:

$$R^3\!-\!Si(OR^4)_3 \qquad (2)$$

(where R3 is a straight chain or cyclic alkenyl group, and R4 is a monovalent hydrocarbon group. R3 and R4 are different.)

The number of carbon atoms in the alkenyl group represented by R3 is, for example, 1 to 20, or preferably 1 to 10 in view of ease in preparation or thermal stability.

Examples of the alkenyl group include, to be specific, straight chain alkenyl groups such as a vinyl group, an allyl group, a propenyl group, a butenyl group, a pentenyl group, a hexenyl group, a heptenyl group, and an octenyl group; and cyclic alkenyl groups such as a norbornenyl group and a cyclohexenyl group.

A preferable example is a straight chain alkenyl group, or a more preferable example is a vinyl group in view of reactivity in the addition reaction.

Examples of the monovalent hydrocarbon group represented by R4 include those given as examples of monovalent hydrocarbon groups represented by R1 and R2 in the above-described formula (1). A preferable example is methyl.

Examples of alkenyl group-containing alkoxysilane include, to be specific, vinyltrialkoxysilane such as vinyltrimethoxysilane, vinyltriethoxysilane, and vinyltripropoxysilane; allyltrimethoxysilane; propenyltrimethoxysilane; butenyltrimethoxysilane; pentenyltrimethoxysilane; hexenyltrimethoxysilane; heptenyltrimethoxysilane; octenyltrimethoxysilane; norbornenyltrimethoxysilane; and cyclohexenyltrimethoxysilane.

A preferable example is vinyltrialkoxysilane, and a more preferable example is vinyltrimethoxysilane.

Alkenyl group-containing alkoxysilane may be used alone or in combination of two or more.

Commercially available product of alkenyl group-containing alkoxysilane can be used, or alkenyl group-containing alkoxysilane synthesized based on a known method can also be used.

The mixing ratio of the alkenyl group-containing alkoxysilane is, for example, 0.01 to 90 mass %, preferably 0.01 to 50 mass %, or more preferably 0.01 to 10 mass % per a total amount of the condensation ingredients.

Epoxy group-containing alkoxysilane is a silane compound having an epoxy group and also an alkoxy group. To be specific, epoxy group-containing alkoxysilane is epoxy group-containing trialkoxysilane represented by formula (3) below:

$$R^5\!-\!Si(OR^6)_3 \qquad (3)$$

(where R5 is a glycidylether group, and R6 is a monovalent hydrocarbon group.)

The glycidylether group represented by R5 is a glycidoxyalkyl group represented by formula (4) below:

[Chem. 2]

$$-\!R^7\!-\!O\!-\!CH_2\!-\!\underset{\underset{O}{\diagdown\diagup}}{CH}\!-\!CH_2 \qquad (4)$$

(where R7 is a divalent hydrocarbon group.)

Examples of the divalent hydrocarbon group represented by R7 in the above-described formula (4) include an alkylene group having 1 to 6 carbon atoms such as methylene, ethylene, propylene, and butylene; a cycloalkylene group having 3 to 8 carbon atoms such as cyclohexylene; and an arylene group having 6 to 10 carbon atoms such as phenylene.

A preferable example of the divalent hydrocarbon group is an alkylene group, and a more preferable example is propylene.

To be specific, examples of the glycidylether group represented by R5 include glycidoxymethyl, glycidoxyethyl, glycidoxypropyl, glycidoxycyclohexyl, and glycidoxyphenyl.

Example of the monovalent hydrocarbon group represented by R6 in the above-described formula (3) include the monovalent hydrocarbon group represented by R1 and R2 in the above-described formula (1). A preferable example is methyl.

Examples of epoxy group-containing alkoxysilane include, to be specific, glycidoxyalkyltrimethoxysilane such as glycidoxymethyltrimethoxysilane, (2-glycidoxyethyl) trimethoxysilane, and (3-glycidoxypropyl) trimethoxysilane; (3-glycidoxypropyl) triethoxysilane; (3-glycidoxypropyl) tripropoxysilane; and (3-glycidoxypropyl) triisopropoxysilane.

A preferable example is glycidoxymethyltrialkoxysilane, and a more preferable example is (3-glycidoxypropyl) trimethoxysilane.

Epoxy group-containing alkoxysilane may be used alone or in combination of two or more.

Commercially available product of epoxy group-containing alkoxysilane can be used, or epoxy group-containing alkoxysilane synthesized based on a known method can also be used.

The mixing ratio of epoxy group-containing alkoxysilane is, for example, 0.01 to 90 mass %, preferably 0.01 to 50 mass %, or more preferably 0.01 to 20 mass % per a total amount of the condensation ingredients.

The molar ratio (SiOH/(SiOR$^4$+SiOR$^6$) of the silanol group (SiOH group) in silanol-terminated polysiloxane relative to the alkoxysilyl group (SiOR$^4$ group and SiOR$^6$ group) in alkenyl group-containing alkoxysilane and epoxy group-containing alkoxysilane is, for example, 20/1 to 0.2/1, preferably 10/1 to 0.5/1, or more preferably substantially 1/1.

When the molar ratio exceeds the above-described range, there is a case where a B-stage state product (semi-cured product) having appropriate tenacity cannot be obtained when the phosphor-containing resin composition is allowed to reach its B-stage. On the other hand, when the molar ratio is below the above-described range, the mixing ratio of the alkenyl group-containing alkoxysilane and the mixing ratio of epoxy group-containing alkoxysilane become excessive, and this may cause the obtained fluorescent layer to have poor heat resistance.

When the molar ratio is within the above-described range (preferably substantially 1/1), the silanol group (SiOH group) in the silanol-terminated polysiloxane, and the alkoxysilyl group (SiOR⁴ group) in the alkenyl group-containing alkoxysilane and the alkoxysilyl group (SiOR⁶) in the epoxy group-containing alkoxysilane are allowed to react just enough (neither excessive nor insufficient) in the condensation reaction.

The molar ratio of alkenyl group-containing alkoxysilane relative to epoxy group-containing alkoxysilane is, for example, 10/90 to 99/1, preferably 50/50 to 97/3, or more preferably 80/20 to 95/5. When the molar ratio is within the above-described range, it is advantageous in that strength of the cured product can be ensured, while adhesiveness can be improved.

Organohydrogensiloxane is a compound containing a hydrogen atom that is directly bonded to a silicon atom of the main chain. For example, organohydrogensiloxane is a hydride compound represented by formula (5) below and having a hydrogen atom that is directly bonded to a silicon atom in the middle of the main chain (between both terminals), or a hydride compound (hydrosilyl-terminated polysiloxane) represented by formula (6) below and having a hydrogen atom that is directly bonded to the silicon atom at both terminals of the main chain.

[Chem. 3]

(where I, II, III, and IV are constitutional units, I and IV representing a terminal unit, and II and III representing a repeating unit; and R8 is a monovalent hydrocarbon group that is the same or different. "a" represents an integer of 0 or 1 or more, and "b" represents an integer of 2 or more.)

[Chem. 4]

(where R9 is a monovalent hydrocarbon group that is the same or different. "c" represents an integer of 0 or 1 or more.)

R8 in constitutional unit I, R8 in constitutional unit II, R8 in constitutional unit III, and R8 in constitutional unit IV are preferably the same.

Examples of the monovalent hydrocarbon group represented by R8 include the examples given as the above-described monovalent hydrocarbon groups represented by the above-described R1 and R2. Preferable examples are methyl and ethyl, and a more preferable example is methyl.

Constitutional units I and IV are constitutional units at both terminals.

"a" in constitutional unit II is the number of the repeating unit in constitutional unit II. Preferably, "a" is an integer of 1 to 1000, or more preferably an integer of 1 to 100 in view of reactivity.

"b" in constitutional unit III is the number of the repeating unit in constitutional unit III. Preferably, "b" is an integer of 2 to 10000, or more preferably an integer of 2 to 1000 in view of reactivity.

To be specific, examples of the hydride compound represented by the above-described formula (5) include methylhydrogenpolysiloxane, dimethylpolysiloxane-co-methylhydrogenpolysiloxane, ethylhydrogenpolysiloxane, and methylhydrogenpolysiloxane-co-methylphenylpolysiloxane. A preferable example is dimethylpolysiloxane-co-methylhydrogenpolysiloxane.

The hydride compound represented by the above-described formula (5) may be used alone or in combination of two or more.

The hydride compound represented by the above-described formula (5) is a mixture of compounds. In the compounds, "a" and/or "b" are usually different (that is, molecular weights are different).

Therefore, "a" in constitutional unit II and "b" in constitutional unit III are calculated as average values.

The number average molecular weight of the hydride compound represented by the above-described formula (5) is, for example, 100 to 1,000,000.

R9 in the above-described formula (6) is preferably the same or different. That is, R9 bonded to the silicon atoms at both terminals, and R9 bonded to the silicon atoms between the both terminals are all the same.

Examples of the monovalent hydrocarbon group represented by R9 include those given as examples of monovalent hydrocarbon groups represented by the above-described R1 and R2. Preferable examples are methyl and ethyl.

Preferably, "c" is an integer of 1 to 10,000, or more preferably an integer of 1 to 1,000 in the above-described formula (6) in view of reactivity.

Examples of the hydride compound represented by the above-described formula (6) include, to be specific, hydrosilyl-terminated polydimethylsiloxane, hydrosilyl-terminated polymethylphenylsiloxane, and hydrosilyl-terminated polydiphenylsiloxane.

The hydride compound represented by the above-described formula (6) can be used singly, or can be used in combination of two or more.

The hydride compound represented by the above-described formula (6) is a mixture of compounds. In the compounds, "c" is usually different (that is, molecular weights are different).

Therefore, "c" in the above-described (6) is calculated as an average value.

The number average molecular weight of the hydride compound represented by formula (6) is, for example, 100 to 1,000,000, or more preferably 100 to 100,000 in view of stability and/or handleability.

The viscosity at 25° C. of organohydrogensiloxane is, for example, 10 to 100,000 mPa·s, or preferably 20 to 50,000 mPa·s. The viscosity is measured with a type B viscometer.

As organohydrogensiloxane, a commercially available product can be used, or organohydrogensiloxane synthesized based on a known method can be used.

As organohydrogensiloxane, the hydride compound represented by the above-described formula (5) or the hydride compound represented by the above-described formula (6) can be used singly, or these hydride compounds can be used in combination. Preferably, the hydride compound represented by the above-described formula (5) is used singly as organohydrogensiloxane.

Although the mixing ratio of organohydrogensiloxane depends on the molar ratio between the alkenyl group (R³ in the above-described formula (2)) in alkenyl group-containing alkoxysilane and the hydrosilyl group (SiH group) in organohydrogensiloxane, the mixing ratio of organohydrogensiloxane is, for example, 10 to 10,000 parts by mass, or preferably 100 to 1,000 parts by mass per 100 parts by mass of alkenyl group-containing alkoxysilane.

The molar ratio ($R^3$/SiH) of the alkenyl group ($R^3$ in the above-described formula (2)) in alkenyl group-containing alkoxysilane relative to the hydrosilyl group (SiH group) in organohydrogensiloxane is, for example, 20/1 to 0.05/1, preferably 20/1 to 0.1/1, more preferably 10/1 to 0.1/1, particularly preferably 10/1 to 0.2/1, or most preferably 5/1 to 0.2/1. The molar ratio ($R^3$/SiH) can also be set to, for example, below 1/1 and 0.05/1 or more.

When the molar ratio exceeds 20/1, there may be a case where a semi-cured product having appropriate tenacity cannot be obtained at the time when the phosphor-containing resin composition is allowed to reach its B-stage, and when the molar ratio is below 0.05/1, the mixing ratio of the organohydrogensiloxane is excessively high, and therefore there is a case where heat resistance and tenacity of the fluorescent layer to be obtained become insufficient.

When the molar ratio is below 1/1 and 0.05/1 or more, compared with the case where the phosphor-containing resin composition has a molar ratio of 20/1 to 1/1, the phosphor-containing resin composition is allowed to reach its B-stage rapidly at the time of allowing the phosphor-containing resin composition to reach its B-stage.

The silicone resin composition is prepared by blending the above-described silanol-terminated polysiloxane, alkenyl group-containing alkoxysilane, epoxy group-containing alkoxysilane, and organohydrogensiloxane with a catalyst, and stirring them to be mixed.

Examples of the catalyst include a condensation catalyst and an addition catalyst (hydrosilylation catalyst).

The condensation catalyst is not particularly limited as long as the condensation catalyst is a substance that improves a reaction speed of condensation reaction between a silanol group and an alkoxysilyl group. Examples of the condensation catalyst include acids such as hydrochloric acid, acetic acid, formic acid, and sulfuric acid; bases such as potassium hydroxide, sodium hydroxide, potassium carbonate, and tetramethylammonium hydroxide; and metal catalysts such as aluminum, titanium, zinc, and tin.

Of these examples of the condensation catalysts, preferably, the bases are used, or more preferably, tetramethylammonium hydroxide is used in view of compatibility and pyrolysis characteristics.

The mixing ratio of the condensation catalyst is, for example, 0.1 to 50 mol, or preferably 0.5 to 5 mol per 100 mol of silanol-terminated polysiloxane.

The addition catalyst is not particularly limited as long as the addition catalyst is a substance that improves a reaction speed of addition reaction, that is, hydrosilylation reaction between an alkenyl group and SiH. Examples of the addition catalyst include platinum catalysts such as platinum black, platinum chloride, chloroplatinic acid, a platinum-olefin complex, a platinum-carbonyl complex, and platinum-acetylacetate; and metal catalysts such as a palladium catalyst and a rhodium catalyst.

Of these examples of the addition catalysts, preferably, a platinum catalyst, or more preferably, a platinum-carbonyl complex is used in view of compatibility, transparency, and catalytic activity.

The mixing ratio of the addition catalyst is, based on parts by mass of the metal amount of the addition catalyst, for example, $1.0 \times 10^{-4}$ to 1.0 parts by mass, preferably $1.0 \times 10^{-4}$ to 0.5 parts by mass, or more preferably $1.0 \times 10^{-4}$ to 0.05 parts by mass per 100 parts by mass of organohydrogensiloxane.

The above-described catalysts may be used in a solid state as is, or in view of handleability, the above-described catalysts may also be used as a solution by dissolving the catalyst in a solvent, or as a dispersion liquid by dispersing the catalyst in a solvent.

Examples of the solvent include water; and alcohols such as methanol and ethanol. Preferably, alcohol is used.

To prepare a silicone resin composition, for example, the above-described ingredients (condensation ingredient and addition ingredient) and catalysts are mixed at once. Alternatively, each of the ingredients and each of the catalysts are separately added at different timing. Alternatively, a portion of the components is added at once, and the remaining components are individually added at different times.

Preferably, the condensation ingredients and the condensation catalysts are added at once first; then the addition ingredients are added; and thereafter, addition catalysts are added.

To be specific, silanol-terminated polysiloxane, alkenyl group-containing alkoxysilane, and epoxy group-containing alkoxysilane (that is, condensation ingredients) are blended with a condensation catalyst at the above-described ratio at once, and the mixture is stirred, for example, for 5 minutes to 24 hours.

At the time of blending and stirring, the mixture may be heated, for example, to 0 to 60° C. for improving compatibility and handleability of the condensation ingredients.

At the time of blending the ingredient with a condensation catalyst, a compatibilizer for improving compatibility of these may also be added in an appropriate amount.

Examples of the compatibilizer include an organic solvent such as alcohol (for example, methanol). When the condensation catalyst is prepared as a solution or dispersion liquid in which the condensation catalyst is dissolved or dispersed in an organic solvent, the organic solvent may also be used as a compatibilizer.

Thereafter, the pressure of the system is reduced as necessary so that the volatile component (organic solvent) is removed.

Then, organohydrogensiloxane is blended with the obtained mixture of condensation ingredient and condensation catalyst, and the mixture is stirred, for example, for 1 to 60 minutes.

At the time of blending and stirring, the mixture may also be heated, for example, to 0 to 60° C. to improve compatibility of the mixture and organohydrogensiloxane, and handleability of them.

Thereafter, an addition catalyst is blended into the system, and the mixture is stirred, for example, for 1 to 60 minutes.

The silicone resin composition is prepared in this manner.

The boron compound-containing silicone resin composition contains, for example, silanol-terminated polysiloxane and a boron compound.

Example of silanol-terminated polysiloxane include silanol-terminated polysiloxane represented by the above-described formula (1).

Example of the boron compound include, to be specific, a boric acid compound represented by formula (7) below:

[Chem. 5]

(7)

(where Y1, Y2, and Y3 are independently hydrogen or an alkyl group.)

The number of carbon atoms of the alkyl group represented by Y1, Y2, and Y3 is, for example, 1 to 12, preferably 1 to 6, or more preferably 1 to 3.

Examples of alkyl represented by Y1, Y2, and Y3 include, to be specific, methyl, ethyl, propyl, and isopropyl. Preferable examples are ethyl and isopropyl, and a more preferable example is isopropyl.

Examples of the boron compound include, to be specific, acid such as boric acid; and boric acid triesters such as trimethyl borate, triethyl borate, tripropyl borate, and triisopropyl borate.

The boron compound may be used alone or in combination of two or more.

The mixing ratio of silanol-terminated polysiloxane to boron compound is, based on the mass ratio of silanol-terminated polysiloxane to boron compound (parts by mass of silanol-terminated polysiloxane/parts by mass of boron compound), for example, 95/5 to 30/70, preferably 95/5 to 50/50, more preferably 95/5 to 60/40, or particularly preferably 95/5 to 70/30 in view of heat resistance, transparency, and light resistance.

The molar ratio (Si/B) of silicon atoms in silanol-terminated polysiloxane relative to boron atoms in the boric acid compound is, for example, 2/1 to 1000/1, preferably 4/1 to 500/1, or more preferably 6/1 to 200/1.

When the molar ratio is below the above-described range, there is a case where the fluorescent layer that has reached its B-stage becomes excessively hard. On the other hand, when the molar ratio exceeds the above-described range, there is a case where the fluorescent layer that has reached its B-stage becomes excessively soft, and workability is reduced.

The boron compound-containing silicone resin composition is prepared by blending silanol-terminated polysiloxane and the boron compound at the above-described mixing ratio, and then the mixture is stirred and mixed at room temperature.

The boron compound-containing silicone resin composition may also be prepared in conformity with descriptions of Japanese Unexamined Patent Publication No. 2009-127021 and Japanese Unexamined Patent Publication No. 2009-127020.

The aluminum compound-containing silicone resin composition contains, for example, silanol-terminated polysiloxane and an aluminum compound.

Examples of silanol-terminated polysiloxane include silanol-terminated polysiloxane represented by the above-described formula (1).

The aluminum compound is represented by, to be specific, formula (8) below:

[Chem. 6]

(8)

(where Y4, Y5, and Y6 independently represent hydrogen or an alkyl group.)

The number of carbon atoms of the alkyl group represented by Y4, Y5, and Y6 is, for example, 1 to 12, preferably 1 to 6, or more preferably 1 to 3.

Examples of the alkyl group represented by Y4, Y5, and Y6 include, to be specific, a methyl group, an ethyl group, a propyl group, and an isopropyl group. Preferable examples are an ethyl group, and an isopropyl group, and a more preferable example is isopropyl.

Examples of the aluminum compound include aluminum trialkoxide such as aluminum trimethoxide, aluminum triethoxide, aluminum tripropoxide, aluminum triisopropoxide, and aluminum tributoxide.

The aluminum compound may be used alone or in combination of two or more.

A preferable example is aluminum triisopropoxide.

The mixing ratio of silanol-terminated polysiloxane to the aluminum compound is, based on the mass ratio of silanol-terminated polysiloxane relative to the aluminum compound (silanol-terminated polysiloxane/aluminum compound), for example, 99/1 to 30/70, or preferably 90/10 to 50/50.

The molar ratio (Si/Al) of silicon atoms in silanol-terminated polysiloxane relative to aluminum atoms in the aluminum compound is, for example, 2/1 to 1000/1, preferably 4/1 to 500/1, or more preferably 6/1 to 200/1.

When the molar ratio is below the above-described range, there is a case where the fluorescent layer that has reached its B-stage becomes excessively hard. On the other hand, when the molar ratio exceeds the above-described range, there is a case where the fluorescent layer that has reached its B-stage becomes excessively soft, and workability is reduced.

The aluminum compound-containing silicone resin composition is prepared by blending silanol-terminated polysiloxane and the aluminum compound at the above-described mixing ratio, and then the mixture is stirred and mixed at room temperature.

The aluminum compound-containing silicone resin composition may also be prepared in conformity with descriptions of Japanese Unexamined Patent Publication No. 2009-127021, and Japanese Unexamined Patent Publication No. 2009-235376.

To prepare the phosphor-containing resin composition, the above-described phosphor and silicone resin are blended, and the mixture is stirred to be mixed. The duration of stirring is, for example, 0.5 to 2 hours.

The mixing ratio of phosphor relative to the phosphor-containing resin composition is, for example, 1 to 50 mass %, or for example, 10 to 40 mass %.

In the phosphor-containing resin composition, known additives such as a transmission inhibitor, a modifying agent, a surfactant, a dye, a pigment, a discoloration inhibitor, and an ultraviolet absorber may be added at an appropriate amount.

An embodiment of a method for producing a light-emitting diode device of the present invention is described with reference to FIG. 1.

Figure 1:
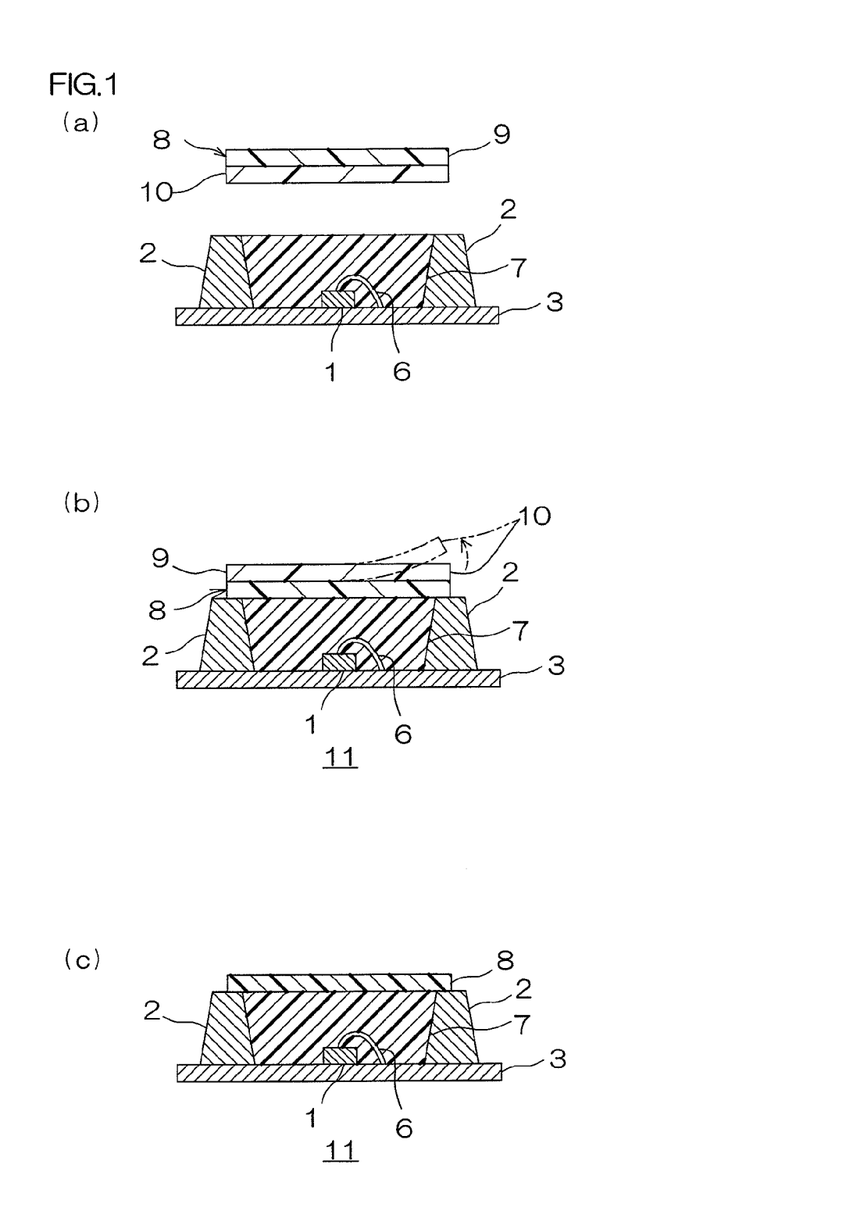
FIG. 1 shows process drawings for describing an embodiment of a method for producing a light-emitting diode device of the present invention, (a) illustrating a step of preparing a sealing layer by charging an interior of a housing with a sealing material and sealing in a light-emitting diode; and preparing a fluorescent layer by allowing a phosphor-containing resin composition to reach its B-stage, (b) illustrating a step of bonding the fluorescent layer to both of the surface of the sealing layer and the surface of the housing, and (c) illustrating a step of allowing the fluorescent layer to adhere to both of the surface of the sealing layer and the surface of the housing by curing the phosphor-containing resin composition.

In this method, as shown in FIG. 1 (a), a sealing layer 7 is prepared by sealing in a light-emitting diode 1 with a sealing material.

The light-emitting diode 1 is mounted on a substrate 3, on which a housing 2 is provided.

The substrate 3 is formed into a flat-plate shape, and is formed from a known insulation resin such as, for example, polyimide resin.

Although not shown in FIG. 1, on the upper face of the substrate 3, a wire for electrically connecting a terminal of the light-emitting diode 1 and a terminal (not shown) of a power source for supplying electricity to the light-emitting diode 1 is formed.

The housing 2 is generally a frame shape when viewed from the top, and is formed into a generally trapezoid tube shape extending upward to gradually be narrower. The housing 2 is disposed so as to surround the light-emitting diode 1. The housing 2 thus sets the region where the light-emitting diode 1 is accommodated. The housing 2 is formed from, for example, a sintered body of ceramic materials containing a light reflective material, and serves as a reflector that reflects light emitted from the light-emitting diode 1.

The light-emitting diode 1 is placed on the upper face of the substrate 3, to be specific, placed within the region encircled by the housing 2, and electrically connected (wire bonded) to a wire (not shown) through the wire 6.

The light-emitting diode 1 is sealed in by charging the interior of the housing 2 with a sealing material composed of the above-described known transparent resin and the like, and thereafter, as necessary, by curing the sealing material.

The sealing layer 7 composed of a sealing material is formed in this manner.

The sealing layer 7 is formed so that the upper face thereof is flush with the upper face of the housing 2 in the thickness direction after being cured.

In this method, a fluorescent layer 8 is prepared by allowing the phosphor-containing resin composition to reach its B-stage.

To be specific, a precursor layer is formed by applying a phosphor-containing resin composition on the surface of a release substrate 10, and then the precursor layer is heated at a predetermined temperature.

The release substrate 10 is formed into a generally flat-plate rectangular sheet shape, and is made from, for example, resin materials such as polyethylene, polypropylene, polyester (e.g., polyethylene terephthalate) or metal materials such as iron, aluminum, and stainless steel. A release treatment is given on the surface (upper face) of the release substrate 10 as necessary to improve release properties from the fluorescent layer 8.

The phosphor-containing resin composition is applied to form a pattern corresponding to the sealing layer 7, to be specific, in a pattern corresponding to both of the upper face of the sealing layer 7 and upper face (inner peripheral end portion of the upper face) of the housing 2.

Examples of the application method include known methods such as spin coating and roll coating.

The heating temperature is, for example, 40 to 300° C., and the heating duration is, 1 minute to 48 hours.

In particular, when the silicone resin is composed of the silicone resin composition, heating conditions are conditions that allows condensation reaction to proceed but does not allow addition reaction (hydrosilylation reaction) to proceed. To be specific, the heating temperature is, for example, 40 to 150° C., or preferably 50 to 140° C. and the heating duration is, for example, 1 to 60 minutes, or preferably 3 to 30 minutes.

When the silicone resin is a boron compound-containing silicone resin composition or an aluminum compound-containing silicone resin composition, the heating conditions are conditions that allow the boron compound-containing silicone resin composition or aluminum compound-containing silicone resin composition to partially react, but does not react completely. To be specific, the heating temperature is, for example, 50 to 300° C., or preferably 100 to 200° C., and the heating duration is, for example, 5 to 60 minutes, or preferably 10 to 40 minutes.

By the above-described heating, the phosphor-containing resin composition of the precursor layer is allowed to reach its B-stage, and the fluorescent layer 8 can be prepared in this manner.

The B-stage state is a state between A stage in which the phosphor-containing resin composition in the precursor layer is soluble in the solvent, and C stage in which the phosphor-containing resin composition in the precursor layer is completely cured; and is a state in which curing and gelling of the phosphor-containing resin composition progress a little, the phosphor-containing resin composition is swollen in the solvent but not completely dissolved, and the phosphor-containing resin composition is softened by being heated but not melted.

The fluorescent layer 8 has pressure-sensitive adhesiveness (tackiness). The fluorescent layer 8 has a thickness of, for example, 10 to 5000 μm, or preferably 40 to 400 μm.

Next, as indicated by the arrow in FIG. 1 (a) and in FIG. 1 (b), the fluorescent layer 8 is turned over and bonded to the surface of the sealing layer 7.

To be specific, the fluorescent layer 8 is bonded to the upper face of the sealing layer 7 so that peripheral end portions of the fluorescent layer 8 spill over to the outside (upper face of the housing 2) of the sealing layer 7. To be specific, the fluorescent layer 8 is bonded to the entire face of the upper face of the sealing layer 7 and to the inner peripheral end portions of the upper face of the housing 2.

Thereafter, as shown in FIG. 1 (c), the fluorescent layer 8 is cured by heat.

The heating conditions are the conditions that cause the phosphor-containing resin composition in the fluorescent layer 8 to be completely cured. That is, when the silicone resin is a silicone resin composition, the conditions are such that addition reaction (hydrosilylation reaction) proceeds, and when the silicone resin is a boron compound-containing silicone resin composition or an aluminum compound-containing silicone resin composition, conditions are such that reactions of these compositions proceed completely.

To be specific, the heating temperature is, for example, more than 125° C. and 250° C. or less, and the heating duration is, for 30 minutes to 24 hours.

With these conditions, the fluorescent layer 8 is allowed to be cured, and to adhere to the upper face of the sealing layer 7 and upper face of the housing 2.

A light-emitting diode device 11 is obtained in this manner.

With the above-described method, the light-emitting diode 1 is sealed in with the sealing material in advance, and therefore even if the fluorescent layer 8 is bonded to the upper face of the sealing layer 7, damages to the light-emitting diode 1 can be reliably prevented.

Thus, reliability of the light-emitting diode 1, and even of the light-emitting diode device 11 can be improved.

As a result, an excellently reliable light-emitting diode device 11 can be used in various semiconductor devices.

Furthermore, as shown in FIG. 1 (a), at the time of placing the housing 2 so as to surround the light-emitting diode 1, when the sealing layer and the fluorescent layer are laminated in advance, and when the housing 2 is charged with the sealing layer of the laminate (not shown), the peripheral end portions of the sealing layer are disposed between the housing 2 and the fluorescent layer, and therefore the portions are pressed by the housing 2 and the fluorescent layer, which may cause the peripheral end portions of the sealing layer to spill over to the outside of the housing 2. In such a case, functions of the light-emitting diode device 11 may be affected.

However, in the above-described method, the fluorescent layer 8 is bonded to both of the upper face of the sealing layer 7 and to the upper face of the housing 2, and therefore the sealing layer 7 can be prevented from spilling over to the outside of the housing 2.

Furthermore, because the fluorescent layer 8 is in B-stage in FIG. 1 (b), the fluorescent layer 8 can be bonded to the surface of the housing 2, and thereafter, by curing the phosphor-containing resin composition of the precursor layer, the fluorescent layer 8 is allowed to reliably adhere to the surface of the housing 2. Thus, reliability of the light-emitting diode device 11 can further be improved.

Without necessity to provide an adhesive separately between the fluorescent layer 8 and the housing 2, producing costs can also be reduced.

Figure 2:
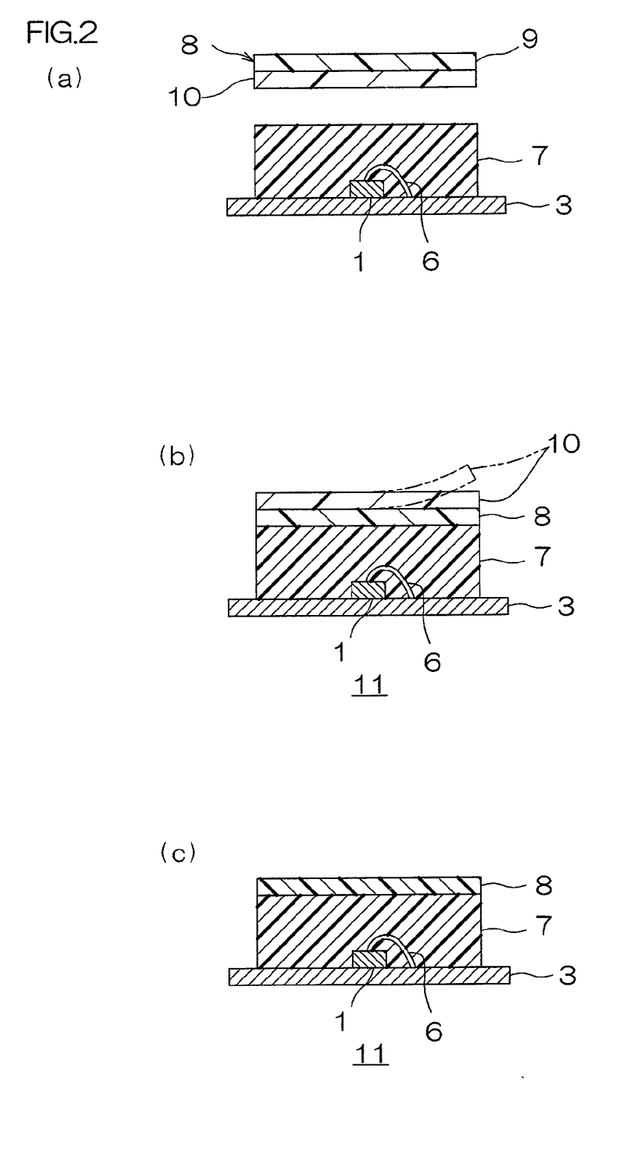
FIG. 2 shows process drawings for describing another embodiment (embodiment in which the housing is not provided) of a method for producing a light-emitting diode device of the present invention, (a) illustrating a step of preparing a sealing layer by sealing in a light-emitting diode with a sealing material, and preparing a fluorescent layer by allowing a phosphor-containing resin composition to reach its B-stage, (b) illustrating a step of bonding the fluorescent layer to the surface of the sealing layer, and (c) illustrating a step of curing the phosphor-containing resin composition, and allowing the fluorescent layer to adhere to the surface of the sealing layer.

FIG. 2 shows process drawings for describing another embodiment (embodiment in which the housing is not provided) of a method for producing a light-emitting diode device of the present invention.

In FIG. 2, members corresponding to the above-described members are given the same reference numerals, and detailed descriptions thereof are omitted.

Although the housing 2 is placed so as to surround the light-emitting diode 1 in the above description, for example, as shown in FIG. 2, the light-emitting diode 1 and the sealing layer 7 can also be provided on the substrate 3 without providing the housing 2.

That is, as shown in FIG. 2 (a), by providing a sealing material on the substrate 3 so as to cover the light-emitting diode 1, the sealing layer 7 is formed. The sealing layer 7 is formed into a generally rectangular shape when viewed in cross section.

Meanwhile, the fluorescent layer 8 is formed into a pattern that corresponds to the upper face of the sealing layer 7.

Then, as shown in FIG. 2 (b), the fluorescent layer 8 is bonded on the upper face of the sealing layer 7.

Thereafter, as shown in FIG. 2 (c), the fluorescent layer 8 is cured by heat.

With the above-described method, the light-emitting diode 1 can be obtained easily.

EXAMPLES

Hereinafter, the present invention is described in further detail with reference to Examples. However, the present invention is not limited to those described in Examples.

Example 1

Preparation of Sealing Layer

A housing was placed on the upper face of a substrate in which a wire was formed, and then a blue light-emitting diode was mounted in the housing. Thereafter, the interior of the housing was charged with a sealing material composed of silicone resin so as to cover the blue light-emitting diode. Thereafter, the sealing material was cured, thereby sealing in the blue light-emitting diode. A sealing layer was prepared in this manner (ref: FIG. 1 (a)).

(Preparation of Fluorescent Layer)

To 2031 g (0.177 mol) of silanol-terminated polydimethylsiloxane (silanol-terminated polysiloxane, in formula (1), all of R1 and R2 was methyl, the average of "n" was 155, and the number average molecular weight was 11,500) that was heated to 40° C., 15.76 g (0.106 mol) of vinyltrimethoxysilane (alkenyl group-containing alkoxysilane) and 2.80 g (0.0118 mol) of (3-glycidoxypropyl) trimethoxysilane (epoxy group-containing alkoxysilane) were blended, and the mixture was stirred to be mixed.

The molar ratio (molarity of SiOH group/molarity of $SiOCH_3$ group) of the SiOH group in silanol-terminated polydimethylsiloxane relative to the $SiOCH_3$ group in vinyltrimethoxysilane and (3-glycidoxypropyl) trimethoxysilane was 1/1.

After the stirring, 0.97 mL (0.766 g, catalyst content: 0.88 mmol, corresponding to 0.50 mol relative to 100 mol of silanol-terminated polydimethylsiloxane) of a solution of tetramethylammonium hydroxide in methanol (condensation catalyst, concentration 10 mass %) was added to the mixture, and the mixture was stirred at 40° C. for 1 hour. The obtained mixture (oil) was stirred at 40° C. under reduced pressure (10 mmHg) for 1 hour, thereby removing a volatile component (such as methanol).

Thereafter, after the pressure of the system was restored to a normal pressure, 44.67 g (0.319 mol) of organohydrogensiloxane (in formula (5), all of R8 was methyl, the average of "a" was 10, the average of "b" was 10, and the viscosity at 25° C. was 20 mPa·s) was added to the reactant, and the mixture was stirred at 40° C. for 1 hour.

The molar ratio ($CH_2$=CH—/SiH) of the vinyl group ($CH_2$=CH—) in vinyltrimethoxysilane relative to the hydrosilyl group (SiH group) in the organohydrogensiloxane was 1/3.

Thereafter, 0.13 g (0.13 mL, platinum content 2 mass %, corresponding to $1.2 \times 10^{-4}$ parts by mass of platinum relative to 100 parts by mass of organohydrogensiloxane) of a solution of a platinum-carbonyl complex in oligosiloxane (addition catalyst, platinum concentration 2 mass %) was added to the system, and then the mixture was stirred at 40° C. for 10 minutes.

A silicone resin composition was prepared in this manner.

Thereafter, to 74 g of the prepared silicone resin composition, 26 g of $Y_3Al_5O_{12}$: Ce (YAG: Ce) was added, and the mixture was stirred at room temperature for 1 hour, thereby preparing a phosphor-containing resin composition.

The prepared phosphor-containing resin composition was applied on the surface of a release substrate made of biaxially-drawn polyester film, thereby forming a precursor layer having a thickness of 100 μm.

Then, the precursor layer was heated at 135° C. for 4 minutes so as to allow the phosphor-containing resin composition to reach its B-stage, thereby forming a fluorescent layer having a thickness of 100 μm laminated on a release substrate (ref: FIG. 1 (a)).

(Bonding of Sealing Layer and Fluorescent Layer)

The fluorescent layer was bonded to both of the upper face of the sealing layer and to the upper face of the housing (ref: FIG. 1 (b)).

Then, the release substrate was peeled off from the fluorescent layer, and thereafter, the fluorescent layer was heated at 150° C. for 5 hours to cure the phosphor-containing resin composition, thereby allowing the fluorescent layer to adhere to both of the upper face of the sealing layer and to the upper face of the housing (ref: FIG. 1 (c)).

A blue light-emitting diode device was made in this manner.

Example 2

A blue light-emitting diode device was made in the same manner as in Example 1, except that in the step of preparing the fluorescent layer, instead of the silicone resin composition, a boron compound-containing silicone resin composition was prepared, and a phosphor-containing resin composition was prepared from the boron compound-containing silicone resin composition, and further the heating conditions for allowing the phosphor-containing resin composition to reach its B-stage were changed to 150° C. for 30 minutes.

That is, to 10.0 g (33.3 mmol) of silanol-terminated polydimethylsiloxane (in formula (1), all of R1 and R2 was methyl, the average of "n" was 5, and number average molecular weight was 300), 4.22 g (22.4 mmol) of triisopropyl borate was added, and the mixture was stirred at room temperature for 2 hours, thereby preparing a boron compound-containing silicone resin composition.

The molar ratio (Si/B) of silicon atoms in silanol-terminated polydimethylsiloxane relative to boron atoms in the boron compound-containing silicone resin composition was 6/1.

Example 3

A blue light-emitting diode device was made in the same manner as in Example 1, except that in the step of preparing the fluorescent layer, an aluminum compound-containing silicone resin composition was prepared instead of the silicone resin composition, and a phosphor-containing resin composition was prepared from the aluminum compound-containing silicone resin composition, and further the heating conditions for allowing the phosphor-containing resin composition to reach its B-stage were changed to at 200° C. for 30 minutes.

That is, to 50.0 g (4.35 mmol) of silanol-terminated polydimethylsiloxane (in formula (1), all of R1 and R2 was methyl, the average of "n" was 155, and number average molecular weight was 11,50000), 0.69 g (3.38 mmol) of aluminum triisopropoxide was added, and the mixture was stirred at room temperature for 2 hours, thereby preparing an aluminum compound-containing silicone resin composition.

The molar ratio (Si/Al) of silicon atoms in silanol-terminated polydimethylsiloxane relative to aluminum atoms in the aluminum compound-containing silicone resin composition was 200/1.

Example 4

A blue light-emitting diode device was made in the same manner as in Example 1, except that in the step of preparing the sealing layer, the housing was not provided on the upper face of the substrate (ref: FIG. 2).

That is, in the step of preparing the sealing layer, on the substrate on which a blue light-emitting diode and a wire were formed, the blue light-emitting diode was covered with a sealing material, and thereafter, the sealing material was allowed to be cured, thereby sealing in the blue light-emitting diode (ref: FIG. 2 (a)).

In the step of bonding the sealing layer and the fluorescent layer, the fluorescent layer was bonded to the upper face of the sealing layer (ref: FIG. 2 (b)). Then, the release substrate was peeled off from the fluorescent layer, and thereafter, the phosphor-containing resin composition was allowed to be cured, thereby allowing the fluorescent layer to adhere to the upper face of the sealing layer (ref: FIG. 2 (c)).

Evaluation

As blue light-emitting diode devices of Examples 1 to 4 were visually evaluated, no damage of light-emitting diode or wire was found in any of the blue light-emitting diode devices.

While the illustrative embodiments of the present invention are provided in the above description, such is for illustrative purpose only and it is not to be construed as limiting the scope of the present invention. Modifications and variations of the present invention that will be obvious to those skilled in the art is to be covered by the appended claims.

What is claimed is:

1. A method for producing a light-emitting diode device, the method comprising the steps of: embedding a light-emitting diode with a sealing material, to form a sealing layer, applying a phosphor-containing resin composition containing phosphor and silicon resin to a release substrate, then heating the phosphor-containing resin composition to reach B-stage to form a B-stage fluorescent layer, and after performing both the step of forming the sealing layer and the step of preparing forming the B-stage state fluorescent layer, bonding the B-stage state fluorescent layer to the surface of the sealing layer containing the light-emitting diode.

2. The method for producing a light-emitting diode device according to claim 1, wherein in the step of forming the sealing layer, a housing is placed so as to surround the light-emitting diode, and an interior of the housing is charged with the sealing material, and in the step of bonding the B-stage fluorescent layer to the surface of the sealing layer, the B-stage fluorescent layer is bonded to both of the surface of the sealing layer and the surface of the housing.

* * * * *